United States Patent
Song et al.

(10) Patent No.: US 11,495,918 B2
(45) Date of Patent: Nov. 8, 2022

(54) WAFER AND BACKPLANE CONNECTOR HAVING THE WAFER

(71) Applicant: DONGGUAN LUXSHARE TECHNOLOGIES CO., LTD, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD., Dongguan (CN)

( * ) Notice: Subject to any disclaimer, the term of this patent is extended or adjusted under 35 U.S.C. 154(b) by 53 days.

(21) Appl. No.: 17/334,052

(22) Filed: May 28, 2021

(65) Prior Publication Data

US 2021/0399473 A1    Dec. 23, 2021

(30) Foreign Application Priority Data

Jun. 19, 2020 (CN) .......................... 202010567796.4
Sep. 7, 2020 (CN) .......................... 202021936502.2

(51) Int. Cl.
*H01R 4/66* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CN | 1244959 A | 2/2000 |
| CN | 2513252 Y | 9/2002 |

(Continued)

*Primary Examiner* — Khiem M Nguyen
(74) *Attorney, Agent, or Firm* — Birch, Stewart, Kolasch & Birch, LLP

(57) ABSTRACT

A wafer includes a number of conductive terminals and an insulating frame. The conductive terminals include differential signal terminals, a first ground terminal and a second ground terminal. Each conductive terminal includes a connection portion and a contact portion. The connection portions of the differential signal terminals, the first ground terminal and the second ground terminal are located in a first plane. The first ground terminal includes a first torsion portion and the second ground terminal includes a second torsion portion. The contact portion of the first ground terminal and the contact portion of the second ground terminal are both perpendicular to the first plane. This present disclosure can provide better shielding effect, reduce crosstalk and improve the quality of signal transmission. In addition, the present disclosure also relates to a backplane connector having the wafer.

10 Claims, 24 Drawing Sheets

(51) Int. Cl.

| | | |
|---|---|---|
| H01R 13/40 | (2006.01) | |
| H01R 13/6587 | (2011.01) | |
| H01R 13/6591 | (2011.01) | |
| H01R 13/514 | (2006.01) | |
| H01R 13/518 | (2006.01) | |
| H01R 12/72 | (2011.01) | |
| H01R 13/6586 | (2011.01) | |
| H01R 12/58 | (2011.01) | |
| H05K 1/11 | (2006.01) | |
| H01R 13/6588 | (2011.01) | |
| H01R 13/6583 | (2011.01) | |
| H01R 13/6585 | (2011.01) | |
| H01R 13/6582 | (2011.01) | |
| H01R 43/24 | (2006.01) | |
| H01R 12/71 | (2011.01) | |
| H01R 13/20 | (2006.01) | |
| H01R 13/504 | (2006.01) | |
| H01R 13/6461 | (2011.01) | |
| H01R 13/6584 | (2011.01) | |
| H01R 13/6474 | (2011.01) | |

(52) U.S. Cl.
CPC ........... *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
USPC .................................................. 439/108, 701
See application file for complete search history.

(56) References Cited

U.S. PATENT DOCUMENTS

| | | |
|---|---|---|
| 9,350,126 B2 | 5/2016 | Little et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505878 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207589 A | 12/2016 |
| CN | 205846279 U | 12/2016 |
| CN | 107104329 A | 8/2017 |
| CN | 104009303 B | 1/2018 |
| CN | 107585279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | 201733225 A | 9/2017 |
| TW | I600231 B | 9/2017 |
| TW | I623154 B | 5/2018 |
| TW | 201841440 A | 11/2018 |

(56) References Cited

FOREIGN PATENT DOCUMENTS

| TW | I648925 B | 1/2019 |
|---|---|---|
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

WAFER AND BACKPLANE CONNECTOR HAVING THE WAFER

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202021936502.2, filed on Sep. 7, 2020 and titled "WAFER AND BACKPLANE CONNECTOR HAVING THE WAFER", the entire content of which is incorporated herein by reference.

TECHNICAL FIELD

The present disclosure relates to a wafer and a backplane connector, which belongs to a technical field of connectors.

BACKGROUND

The existing backplane connector usually includes an insulating housing and a plurality of wafers assembled to the insulating housing. Each wafer includes an insulating frame, a plurality of conductive terminals insert-molded with the insulating frame and a metal shield disposed on at least one side of the insulating frame. The plurality of conductive terminals generally include a plurality of pairs of differential signal terminals, a first ground terminal located on one side of each pair of differential signal terminals, and a second ground terminal located on the other side of each pair of differential signal terminals. The first ground terminal, the second ground terminal and the metal shield jointly provide shielding for the differential signal terminals in order to reduce signal crosstalk and improve the quality of signal transmission.

However, there is still room for improvement in the shielding at the location of the contact portions of the differential signal terminals in the prior art.

SUMMARY

An object of the present disclosure is to provide a wafer with better shielding effect of contact portions of conductive terminals, and a backplane connector having the wafer.

In order to achieve the above object, the present disclosure adopts the following technical solution: a wafer, comprising: a plurality of conductive terminals, the conductive terminals comprising differential signal terminals, a first ground terminal and a second ground terminal, the differential signal terminals being located between the first ground terminal and the second ground terminal; each conductive terminal comprising a contact portion and a connection portion; and an insulating frame, at least parts of the connection portions of the conductive terminals being fixed to the insulating frame, the contact portions of the conductive terminals extending beyond the insulating frame; wherein the connection portions of the differential signal terminals, the connection portion of the first ground terminal and the connection portion of the second ground terminal are located in a first plane; and wherein the first ground terminal comprises a first torsion portion connecting the connection portion of the first ground terminal and the contact portion of the first ground terminal; the second ground terminal comprises a second torsion portion connecting the connection portion of the second ground terminal and the contact portion of the second ground terminal; the contact portions of the differential signal terminals are located between the contact portion of the first ground terminal and the contact portion of the second ground terminal; and the contact portion of the first ground terminal and the contact portion of the second ground terminal are both perpendicular to the first plane.

In order to achieve the above object, the present disclosure adopts the following technical solution: a backplane connector, comprising: a plurality of wafers; a header to install the wafers; and a spacer combining the wafers into a whole; each wafer comprising: a plurality of conductive terminals comprising differential signal terminals, a first ground terminal and a second ground terminal, the differential signal terminals being located between the first ground terminal and the second ground terminal; each conductive terminal comprising a contact portion and a connection portion; and an insulating frame, at least parts of the connection portions of the conductive terminals being fixed to the insulating frame, the contact portions of the conductive terminals extending beyond the insulating frame; wherein the connection portions of the differential signal terminals, the connection portion of the first ground terminal and the connection portion of the second ground terminal are located in a first plane; and wherein the first ground terminal comprises a first torsion portion connecting the connection portion of the first ground terminal and the contact portion of the first ground terminal; the second ground terminal comprises a second torsion portion connecting the connection portion of the second ground terminal and the contact portion of the second ground terminal; the contact portions of the differential signal terminals are located between the contact portion of the first ground terminal and the contact portion of the second ground terminal; and the contact portion of the first ground terminal and the contact portion of the second ground terminal are both perpendicular to the first plane.

Compared with the prior art, the first ground terminal and the second ground terminal of the present disclosure include a first torsion portion and a second torsion portion, respectively, so that the contact portion of the first ground terminal and the contact portion of the second ground terminal are both perpendicular to the first plane. With this arrangement, the contact portion of the first ground terminal and the contact portion of the second ground terminal are capable of providing better shielding effect to the contact portions of the differential signal terminals. As a result, the present disclosure reduces crosstalk and improves the quality of signal transmission.

DETAILED DESCRIPTION

Figure 1:
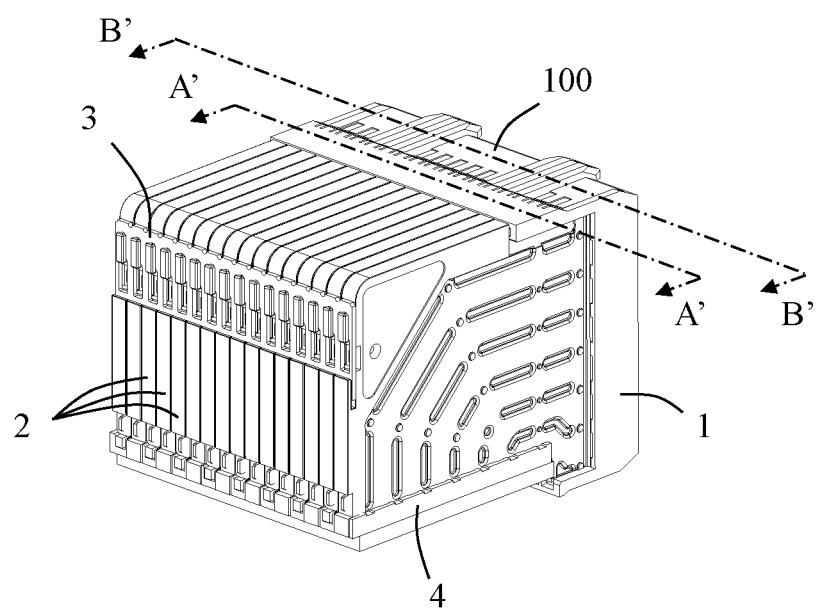
FIG. 1 is a perspective schematic view of a backplane connector in accordance with a first embodiment of the present disclosure when it is mounted on a circuit board.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

First Embodiment

Referring to FIG. 1, an embodiment of the present disclosure discloses a backplane connector 100 including a header 1, a plurality of wafers 2 assembled to the header 1, a spacer 3 combining the plurality of wafers 2 into a whole, and a mounting block 4 mounted at a bottom end of the plurality of wafers 2.

Figure 2:
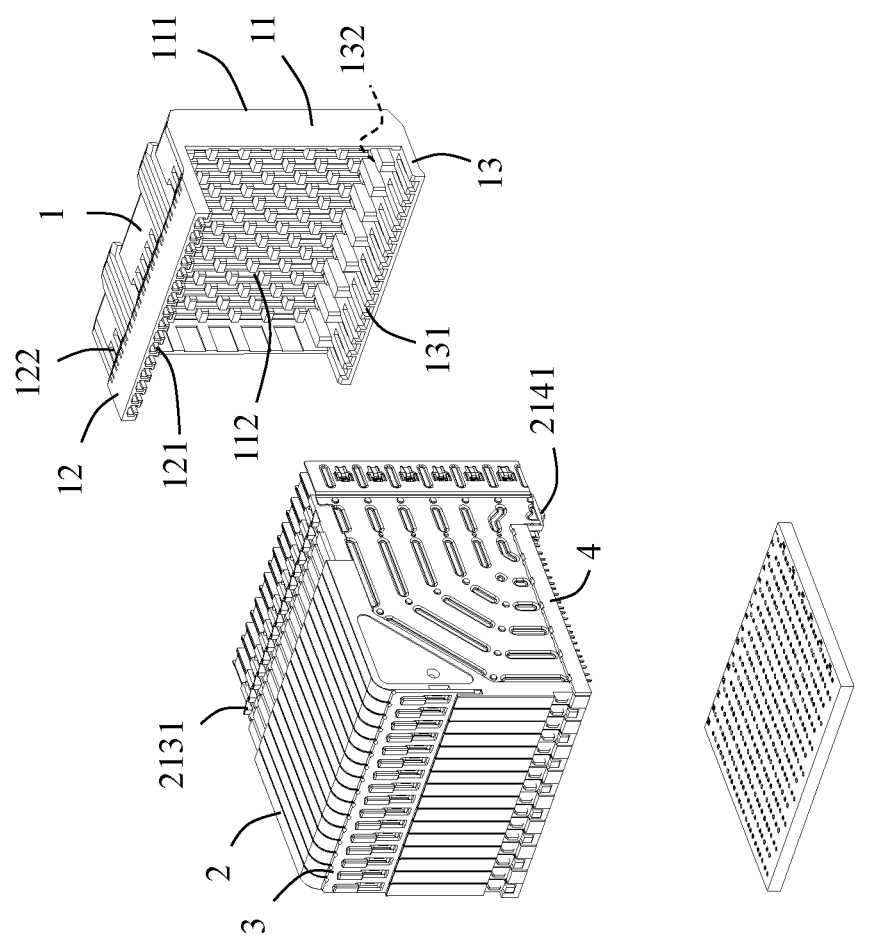
FIG. 2 is a partial perspective exploded view of FIG. 1.
Figure 3:
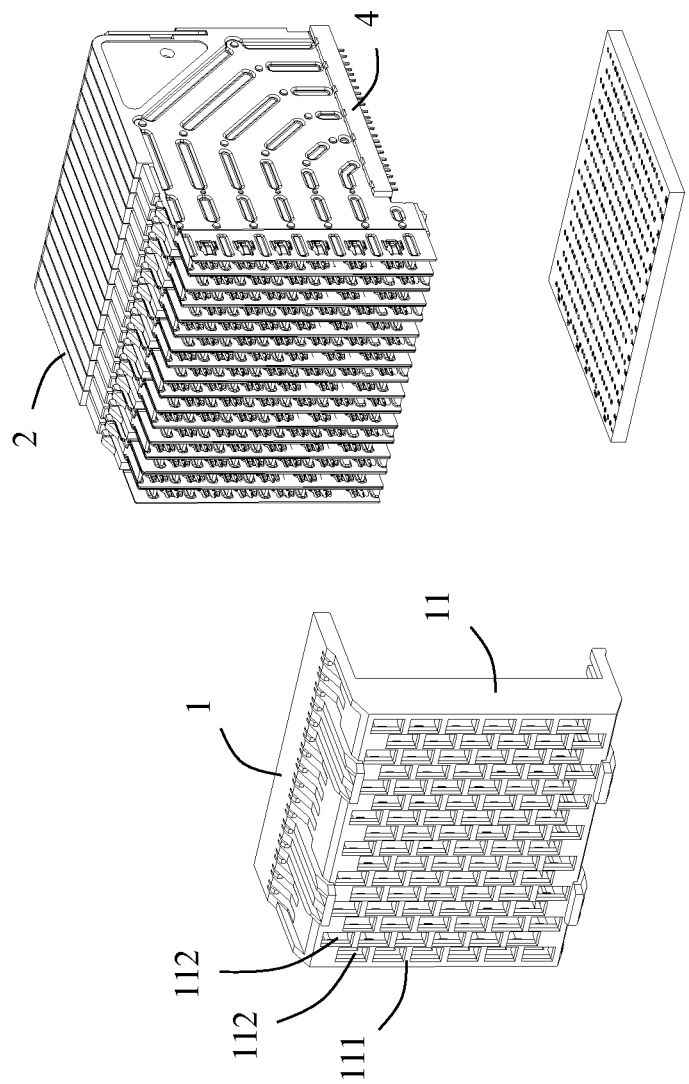
FIG. 3 is a partially exploded perspective view of FIG. 2 from another angle.

Referring to FIGS. 2 and 3, in an embodiment of the present disclosure, the header 1 is made of insulating material. The header 1 includes a body portion 11, a first wall portion 12 extending rearwardly from one side of the body portion 11, and a second wall portion 13 extending rearwardly from the other side of the body portion 11. The first wall portion 12 and the second wall portion 13 are in parallel. The body portion 11 includes a mating surface 111 and a plurality of terminal receiving grooves 112 extending through the mating surface 111. In the illustrated embodiment of the present disclosure, the terminal receiving grooves 112 are disposed in multiple rows along a left-right direction, wherein two adjacent rows of terminal receiving grooves 112 are staggered in a vertical direction. That is, in two adjacent rows of terminal receiving grooves 112, the terminal receiving grooves 112 at corresponding positions are not in alignment in the left-right direction. The first wall portion 12 includes a plurality of first slots 121 and a plurality of first locking grooves 122 communicating with corresponding first slots 121. The second wall portion 13 includes a plurality of second slots 131 and a plurality of second locking grooves 132 communicating with corresponding second slots 131. The first locking grooves 122 and the second locking grooves 132 extend outwardly along the vertical direction through the first wall portion 12 and the second wall portion 13, respectively. The first locking grooves 122 and the second locking grooves 132 are adapted to lock with the wafers 2 in order to prevent the wafers 2 from being separated from the header 1. The first slot 121, the second slot 131 and the terminal receiving grooves 112 which are in alignment with each other along the vertical direction are used to receive the same wafer 2.

Figure 4:
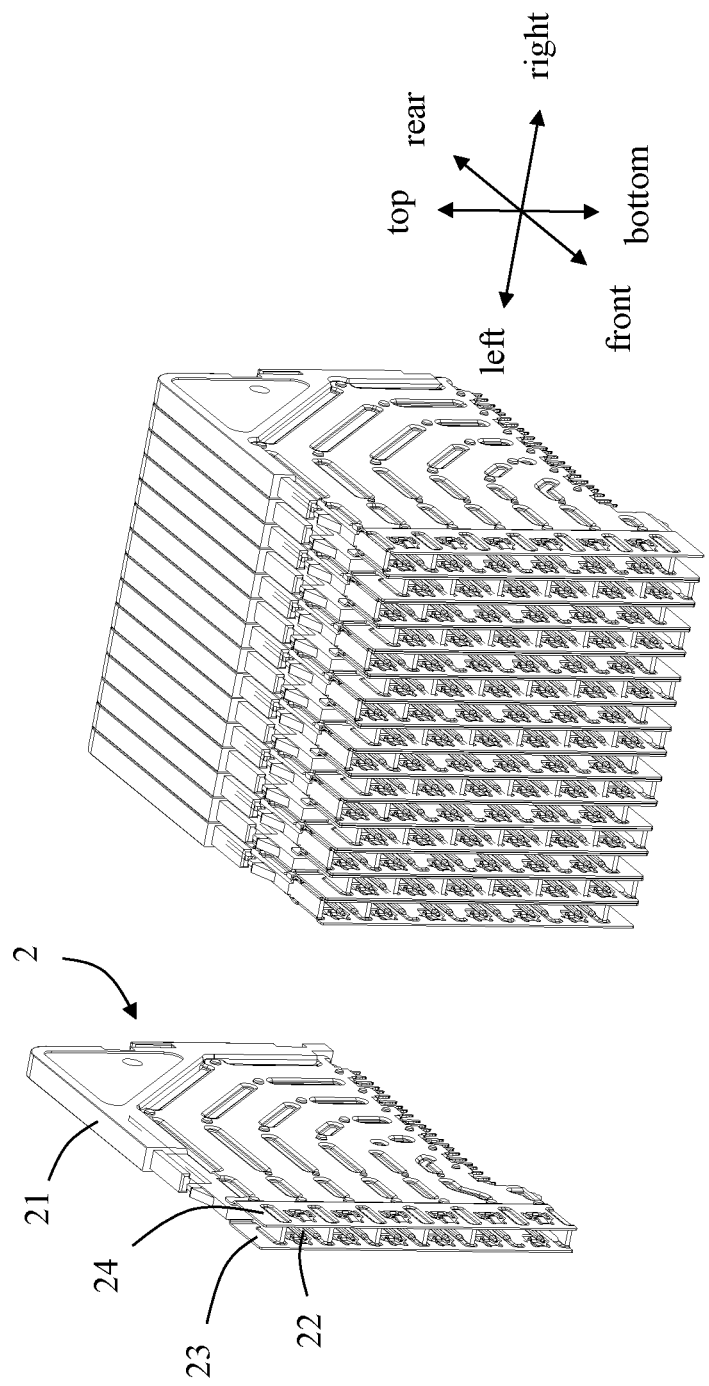
FIG. 4 is a partial perspective exploded view of the backplane connector of the present disclosure, in which one of the wafers is separated.
Figure 5:
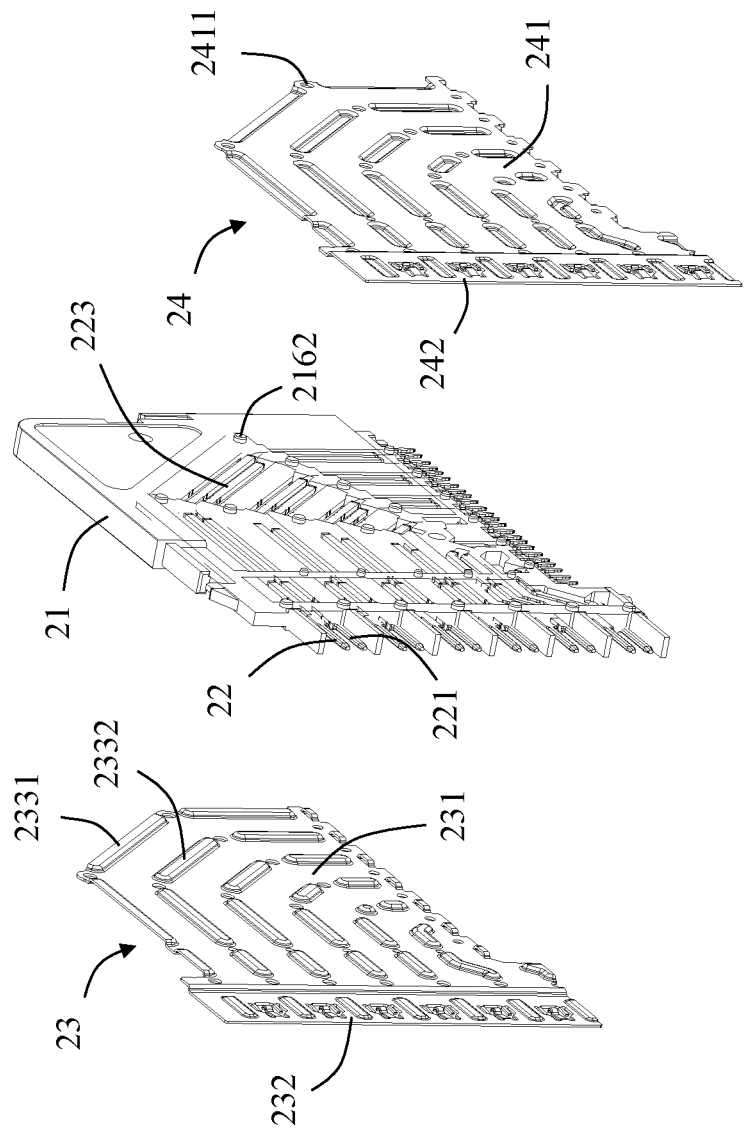
FIG. 5 is a partial perspective exploded view of the wafer in FIG. 4.
Figure 6:
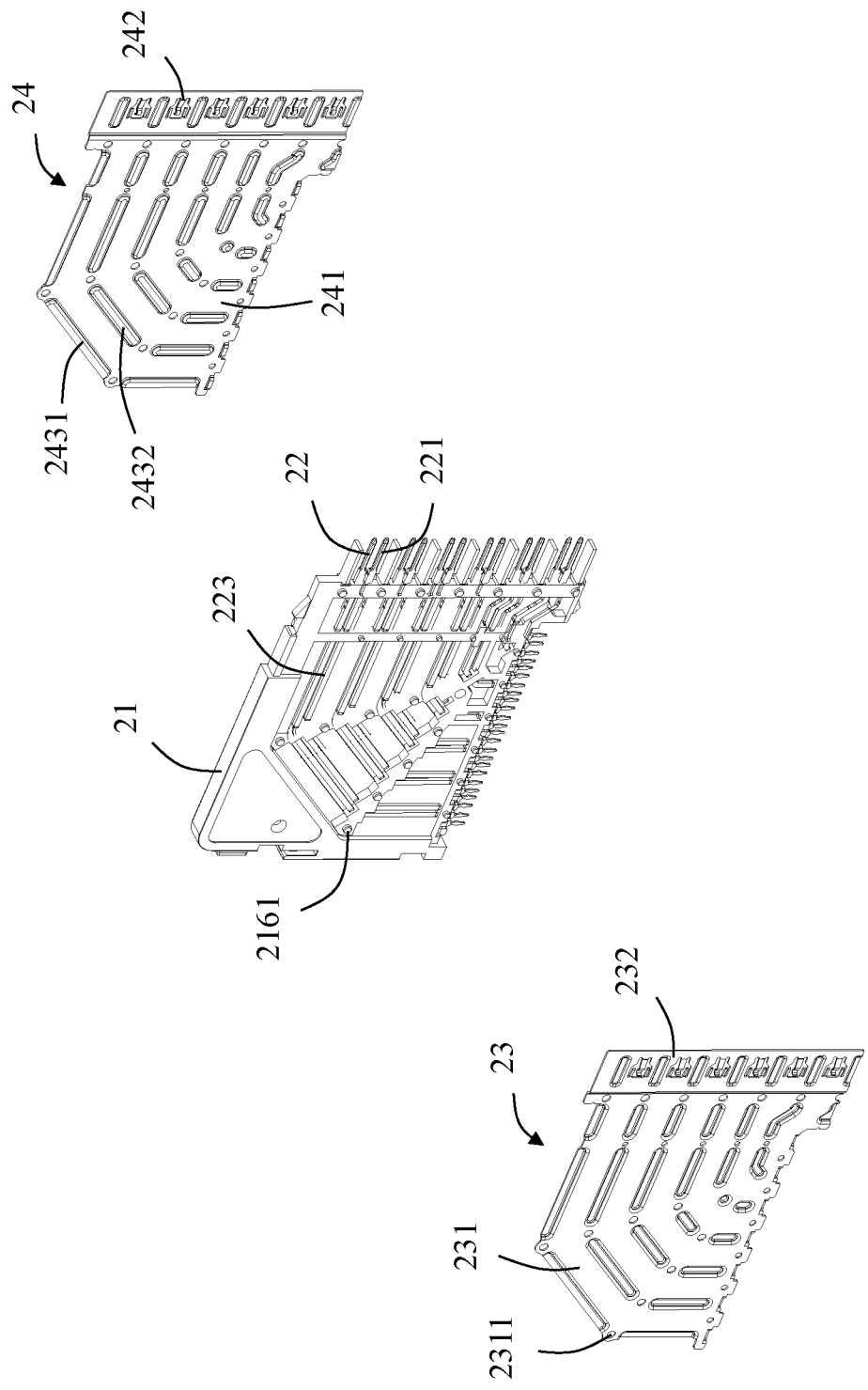
FIG. 6 is a partially exploded perspective view of FIG. 5 from another angle.

Referring to FIGS. 4 to 6, the wafer 2 includes an insulating frame 21, a plurality of conductive terminals 22 fixed to the insulating frame 21, a first metal shield 23 fixed on one side of the insulating frame 21, and a second metal shield 24 fixed on the other side of the insulating frame 21.

Figure 7:
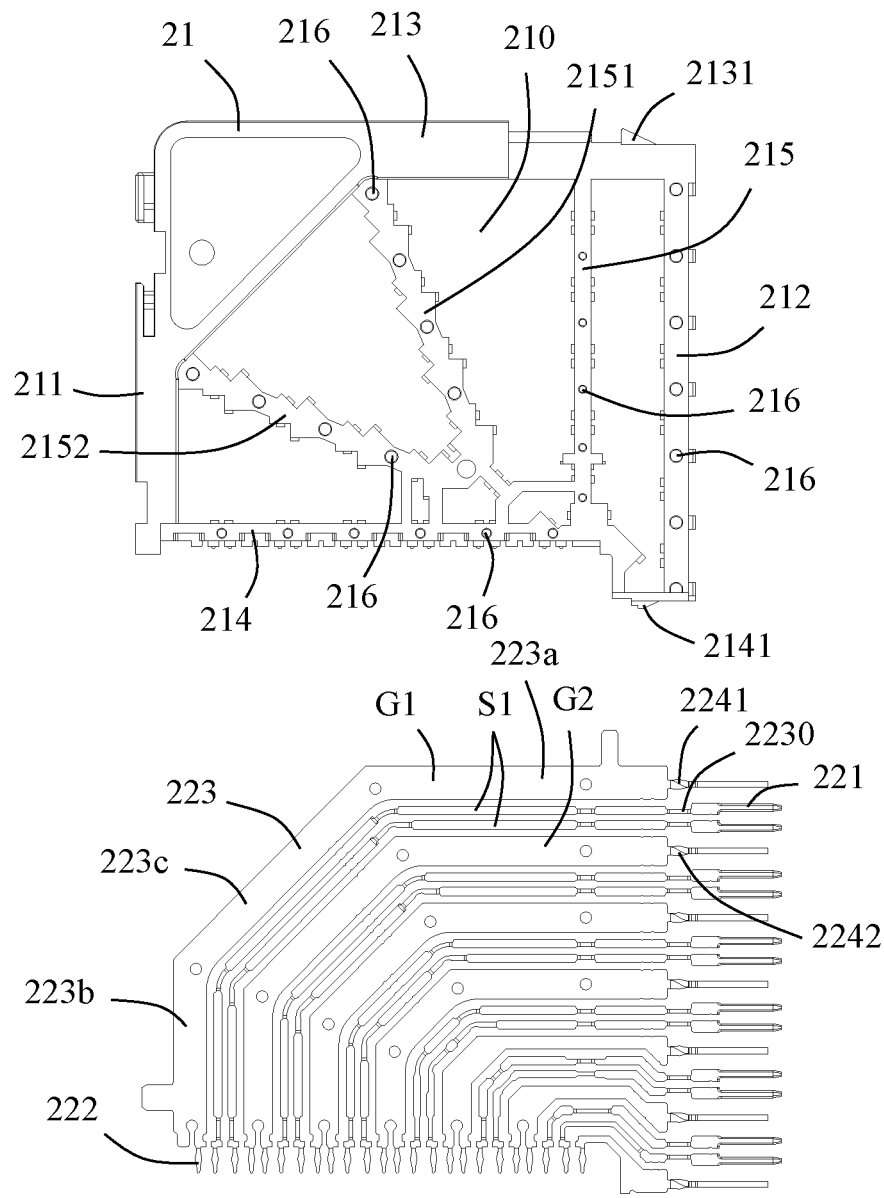
FIG. 7 is a side view of the insulating frame and conductive terminals separated from the insulating frame.

Referring to FIG. 7, each insulating frame 21 is roughly frame-shaped and includes a rear wall 211, a front wall 212 opposite to the rear wall 211, a top wall 213 connecting one end of the rear wall 211 and one end of the front wall 212, a bottom wall 214 connecting the other end of the rear wall 211 and the other end of the front wall 212, and a plurality of connecting walls 215. The connecting walls 215 are capable of enhancing the structural strength of the frame. In the illustrated embodiment of the present disclosure, the insulating frame 21 includes a hollow portion 210. The connecting walls 215 include a first connecting wall 2151 connecting the top wall 213 and the bottom wall 214, and a second connecting wall 2152 connecting the rear wall 211 and the bottom wall 214. The first connecting wall 2151 and the second connecting wall 2152 are exposed in the hollow portion 210. The top wall 213 includes a first locking protrusion 2131 for being inserted into the first locking groove 122. The bottom wall 214 includes a second locking protrusion 2141 for being inserted into the second locking groove 132.

The insulating frame 21 further includes a plurality of posts 216 for fixing the first metal shield 23 and the second metal shield 24. In the illustrated embodiment of the present disclosure, the posts 216 are disposed on the bottom wall 214, the first connecting wall 2151, the second connecting wall 2152 and the front wall 212. The first metal shield 23 and the second metal shield 24 are located on opposite sides of the insulating frame 21, respectively. The posts 216 include a plurality of first posts 2161 and a plurality of second posts 2162. The first posts 2161 and the second posts 2162 are located on opposite sides of the insulating frame 21, respectively, so as to be fixed and positioned with the first metal shield 23 and the second metal shield 24.

Referring to FIG. 7 each conductive terminal 22 includes a contact portion 221, a tail portion 222 and a connection portion 223 connecting the contact portion 221 and the tail portion 222. The contact portion 221 extends beyond the insulating frame 21. Some of the contact portions 221 are used to electrically connect with a mating backplane connector. The tail portions 222 are used for being mounted to a circuit board. In the illustrated embodiment of the present disclosure, the contact portion 221 is substantially perpendicular to the tail portion 222. The connection portion 223 is of a curved configuration. Specifically, the connection portion 223 includes a first section 223a parallel to the contact portion 221, a second section 223b parallel to the tail portion 222, and a third section 223c connecting the first section 223a and the second section 223b. Referring to FIG. 7, the first section 223a extends horizontally. The second section 223b extends vertically. The third section 223c extends obliquely.

Each group of conductive terminals 22 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 22 are arranged in a manner of G1-S1-S1-G2, which is beneficial to improve the quality of signal transmission. The differential signal terminals are narrow-side coupling or wide-side coupling. A width of the first ground terminal G1 and a width the second ground terminal G2 are greater than a width of each signal terminal S1 which is located between the first ground terminal G1 and the second ground terminal G2. Therefore, it is beneficial to increase the shielding area and improve the shielding effect. In the illustrated embodiment of the present disclosure, the first ground terminal G1, the signal terminals S1 and the second ground terminal G2 are stamped and twisted from a metal plate. A thickness of the connection portion 223 of the first ground terminal G1 (along a left-right direction in FIG. 4), a thickness of the contact portion 221 of the first ground terminal G1 (along a top-bottom direction in FIG. 4), a thickness of the connection portion 223 of the second ground terminal G2 (in the left-right direction in FIG. 4) and a thickness of the contact portion 221 of the second ground terminal G2 (in the top-bottom direction in FIG. 4) are the same.

Figure 15:
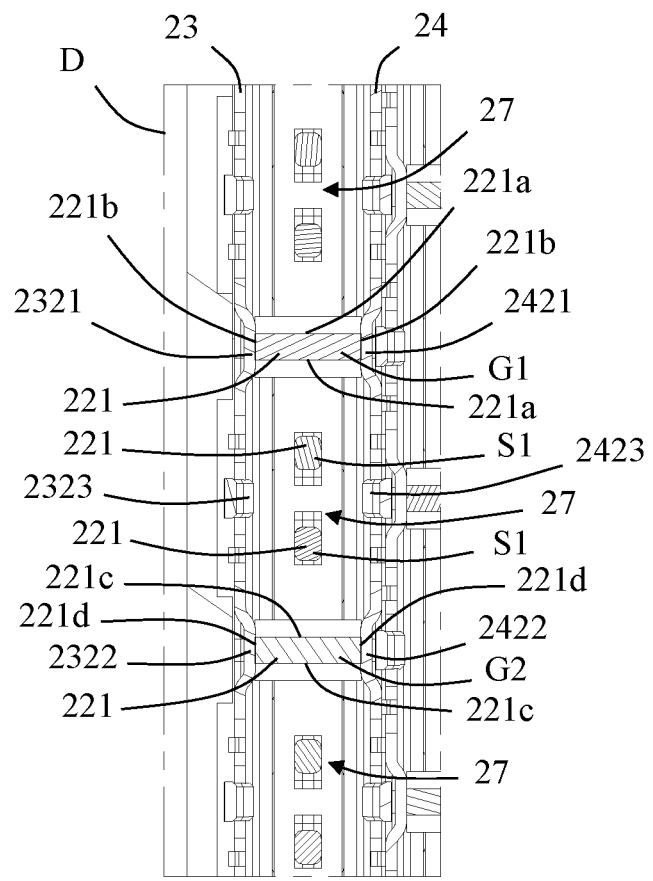
FIG. 15 is a partial enlarged view of a frame part D in FIG. 14.
Figure 16:
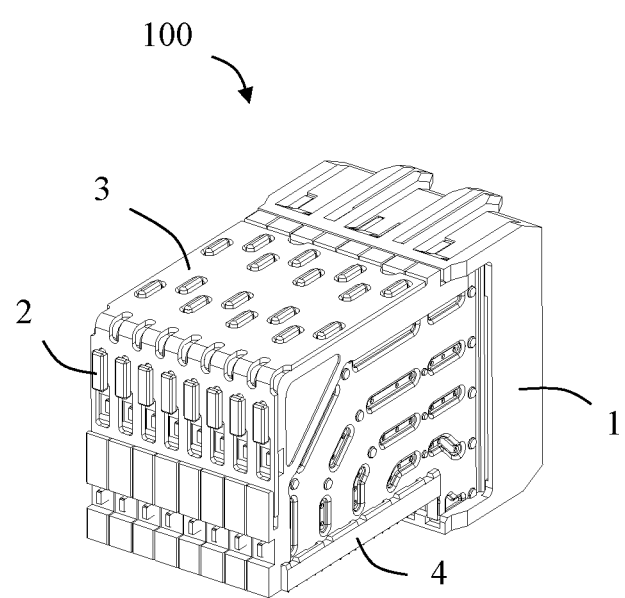
FIG. 16 is a perspective view of the backplane connector in accordance with a second embodiment of the present disclosure.
Figure 17:
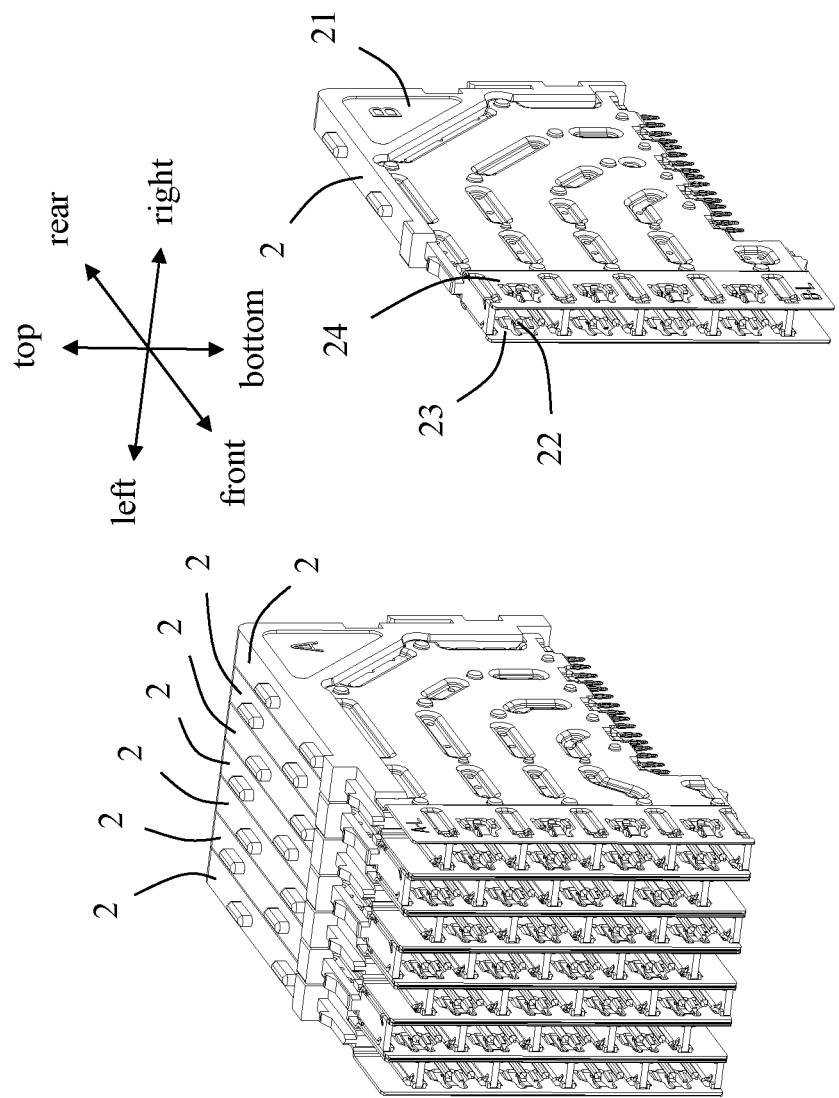
FIG. 17 is a partial perspective exploded view of the backplane connector in FIG. 16, in which one of the wafers is separated.
Figure 18:
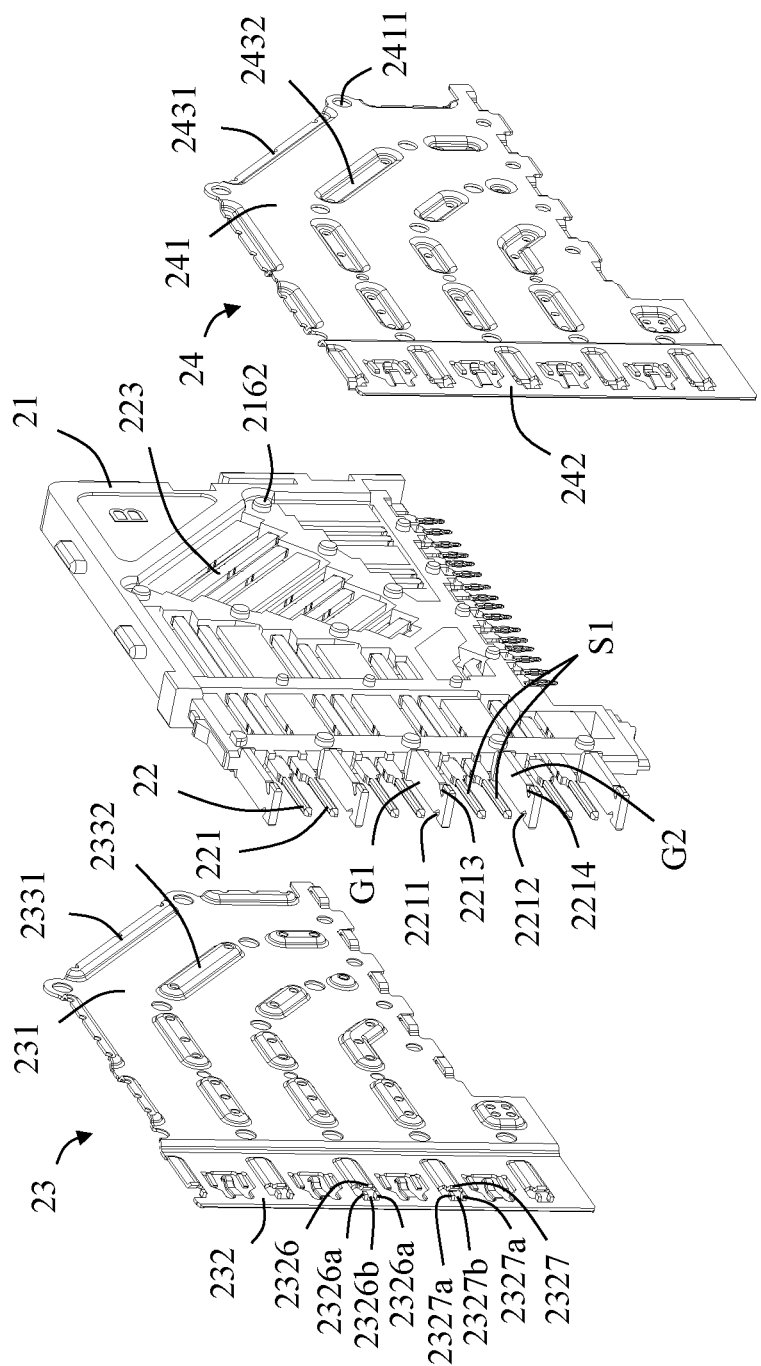
FIG. 18 is a partial perspective exploded view of the wafer in FIG. 17.
Figure 19:
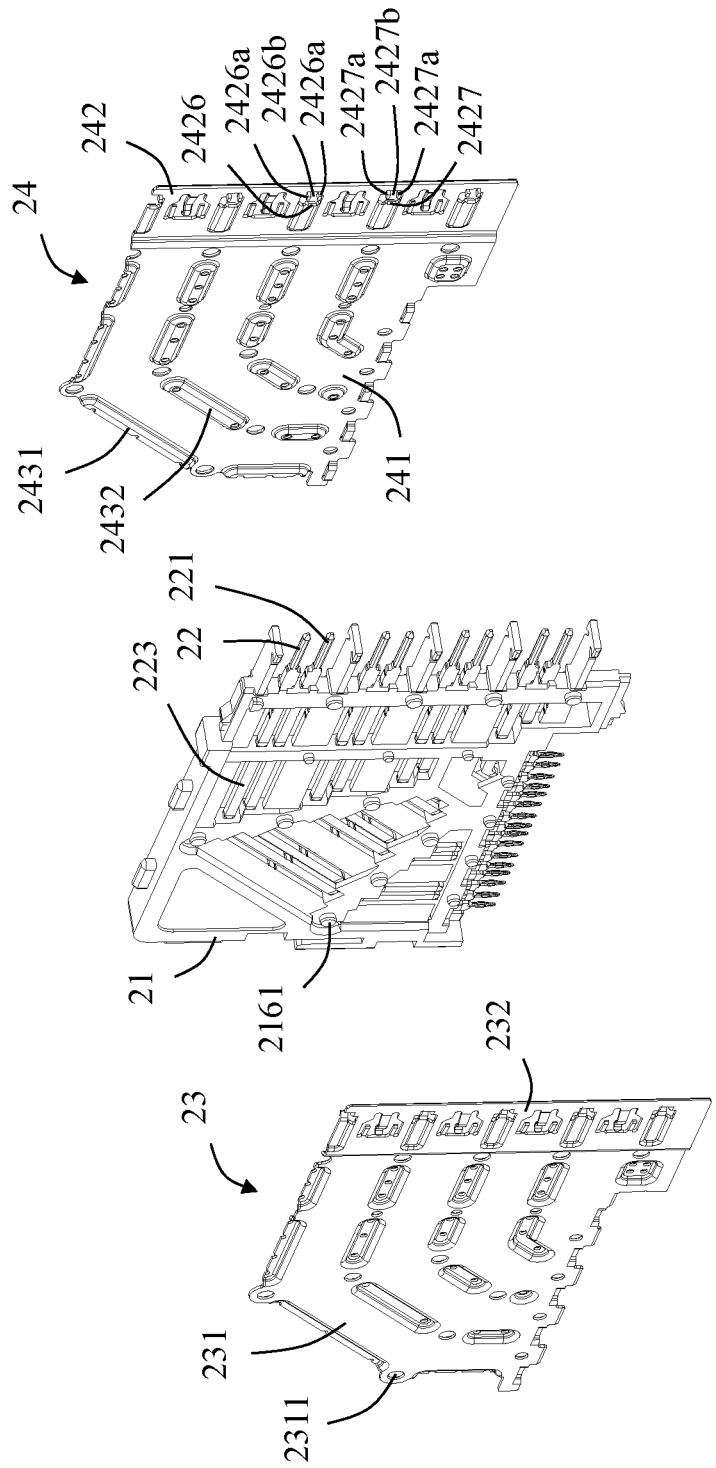
FIG. 19 is a partially exploded perspective view of FIG. 17 from another angle.
Figure 20:
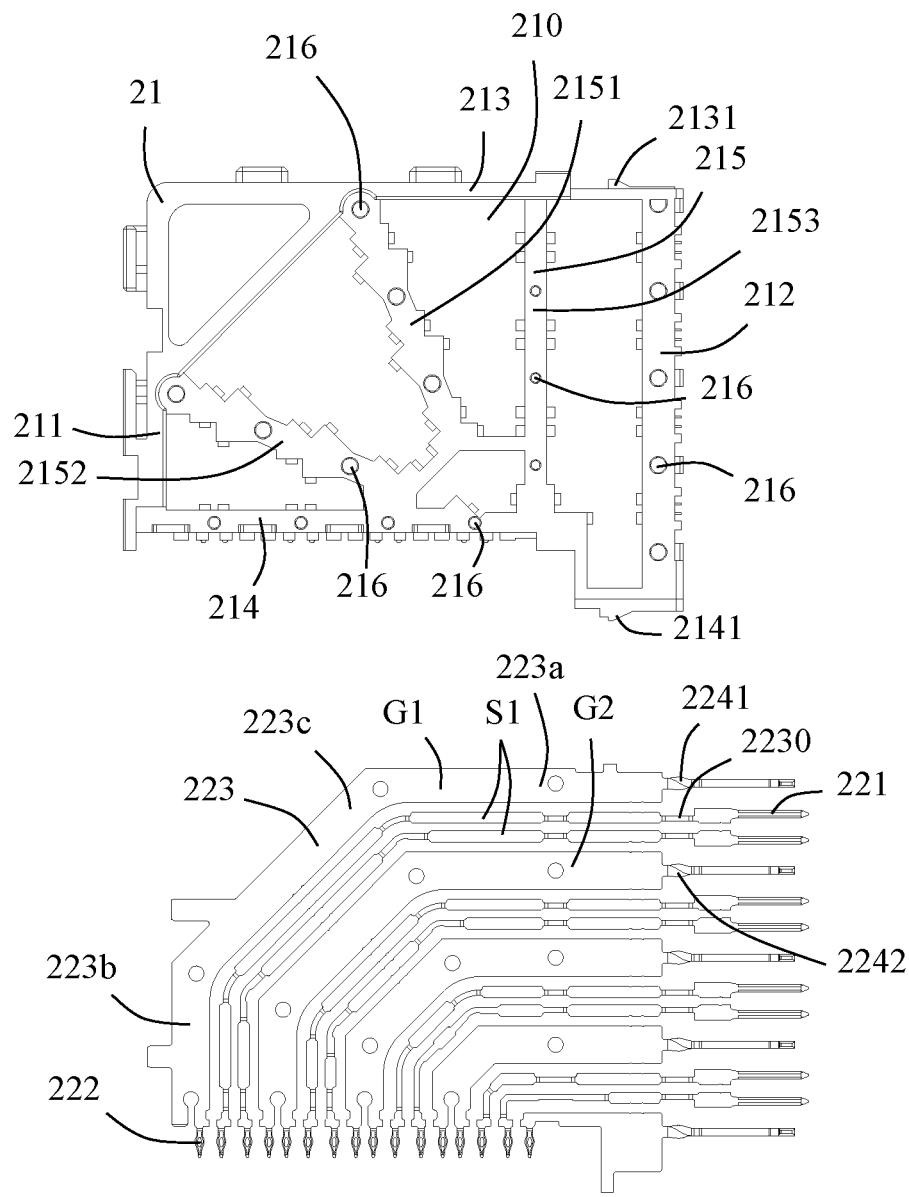
FIG. 20 is a side view when the insulating frame is separated from the conductive terminals.
Figure 21:
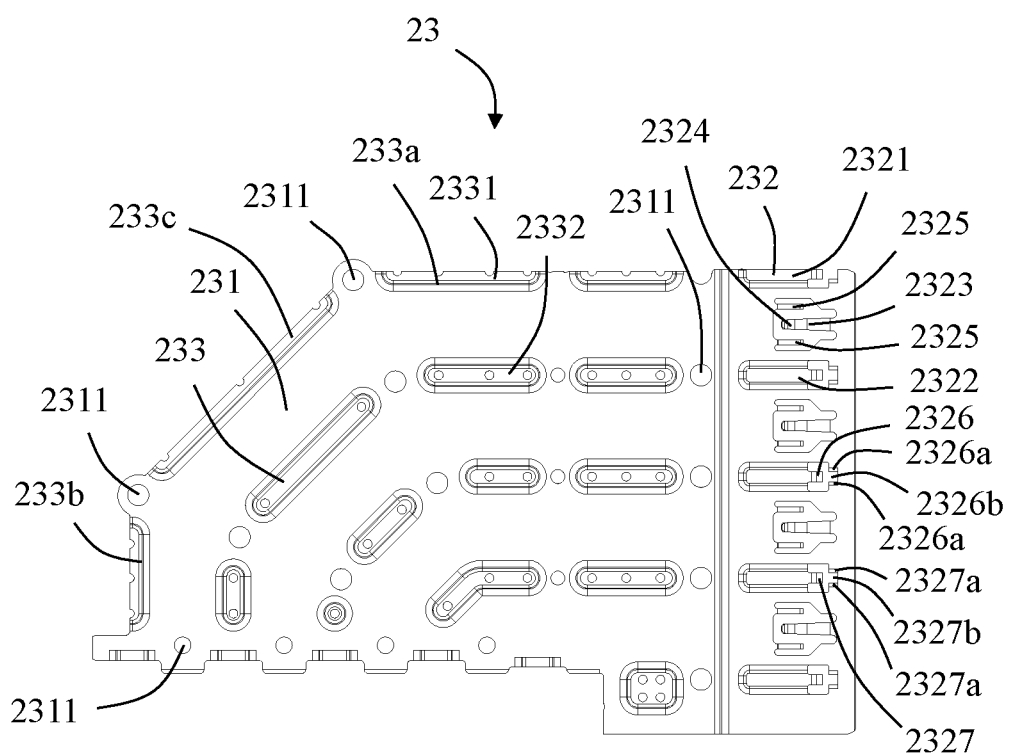
FIG. 21 is a side view of a first metal shield in FIG. 18.
Figure 22:
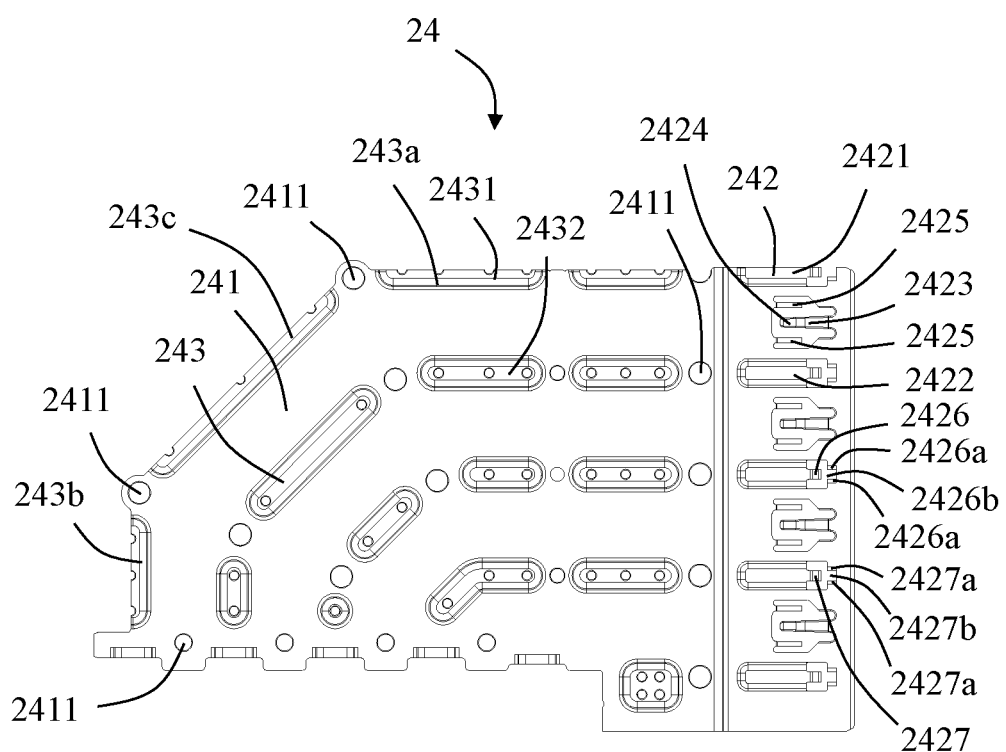
FIG. 22 is a side view of a second metal shield in FIG. 18.
Figure 23:
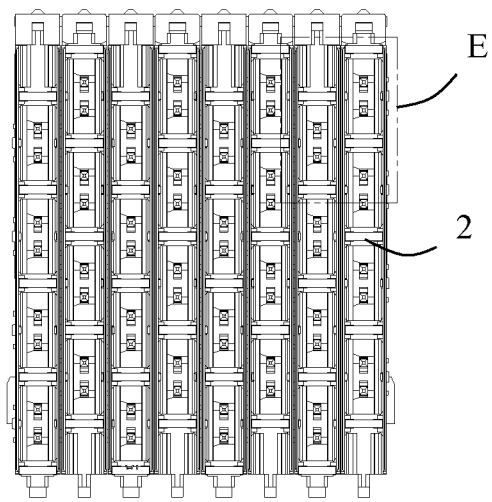
FIG. 23 is a front view of the wafers in FIG. 17 when they are assembled together.
Figure 24:
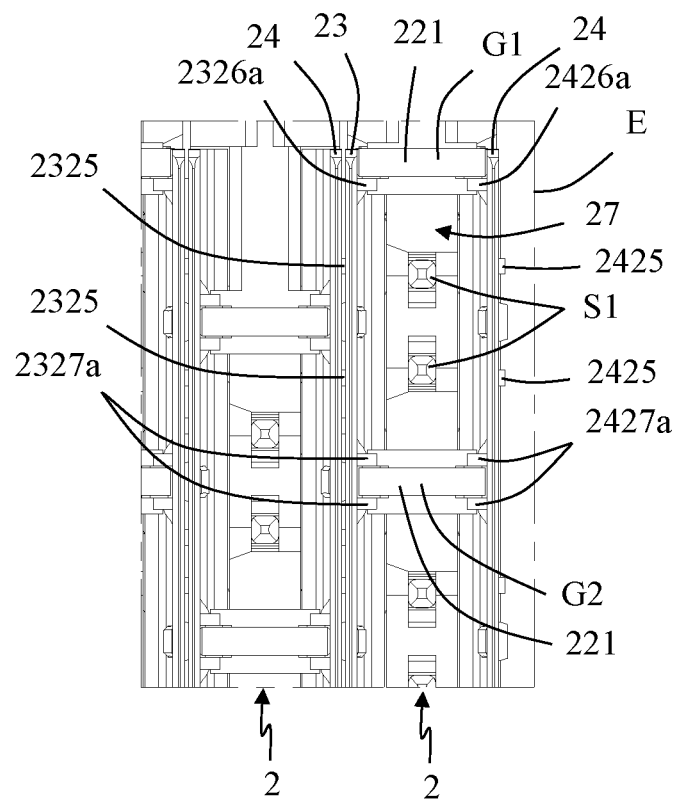
FIG. 24 is a partial enlarged view of a frame part E in FIG. 23.
Figure 25:
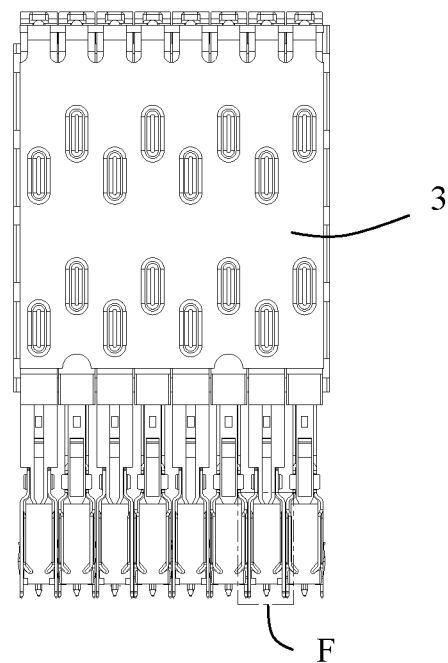
FIG. 25 is a top view of the wafers in FIG. 23.

In the illustrated embodiment of the present disclosure, the connection portions 223 of the conductive terminals 22 are partially insert-molded with the insulating frame 21. Each connection portion 223 of the signal terminal S1 has a narrowed portion 2230 insert-molded with the insulating frame 21 so as to adjust the impedance of the signal terminal S1 for achieving impedance matching. In the illustrated embodiment of the present disclosure, the contact portion 221 of the signal terminal S1 is substantially needle-shaped. The contact portion 221 of the first ground terminal G1 and the contact portion 221 of the second ground terminal G2 are substantially rectangular-shaped. The contact portion 221 of the signal terminal S1 and the connection portion 223 of the conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connected between its contact portion 221 and its first section 223a, so that the contact portion 221 of the first ground terminal G1 is located in a second plane (for example, a vertical plane) perpendicular to the first plane. The second ground terminal G2 includes a second torsion portion 2242 connected between its contact portion 221 and its first section 223a, so that the contact portion 221 of the second ground terminal G2 is also located in the second plane (for example, the vertical plane) perpendicular to the first plane. The first torsion portion 2241 and the second torsion portion 2242 are insert-molded with the front wall 212 of the insulating frame 21. The contact portion 221 of the first ground terminal G1 and the contact portion 221 of the second ground terminal G2 are parallel to each other. Referring to FIGS. 4 and 15, a width of the contact portion 221 of the first ground terminal G1 (along the left-right direction in FIG. 4) and a width of the contact portion 221 of the second ground terminal G2 (along the left-right direction in FIG. 4) are larger than a width of the contact portion 221 of the differential signal terminal (along the left-right direction in FIG. 4). Such a configuration can provide a larger shielding area for the contact portions 221 of the differential signal terminals and improve the shielding effect. Compared with the prior art, by setting the first torsion portion 2241 and the second torsion portion 2242 in the present disclosure, even with a thin metal sheet, the width of the contact portion 221 of the first ground terminal G1 and the width of the contact portion 221 of the second ground terminal G2 can be made larger. This design of the present disclosure avoids the influence of the thickness of the metal sheet itself on the width of the contact portion 221 of the first ground terminal G1 and the width of the contact portion 221 of the second ground terminal G2. The design disclosed in the present disclosure increases the selection range of the metal sheet and reduces the cost.

Figure 8:
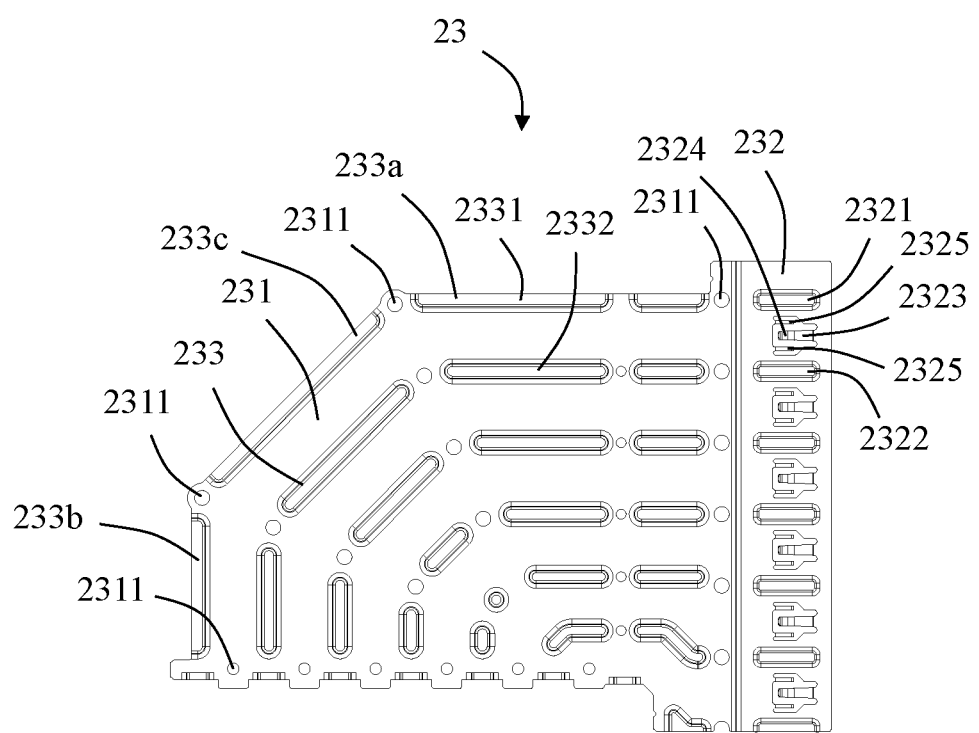
FIG. 8 is a side view of a first metal shield of the backplane connector.

In the illustrated embodiment of the present disclosure, the first metal shield 23 and the second metal shield 24 are symmetrically disposed on opposite sides of the first insulating frame 21. Referring to FIGS. 5, 6 and 8, the first metal shield 23 includes a first main body portion 231 and a first extension portion 232 extending from the first main body portion 231. The first main body portion 231 is located on one side of the connection portions 223 of the conductive terminals 22. The first extension portion 232 is located on one side of the contact portions 221 of the conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the first insulating frame 21 are realized. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the connection portion 223 of the first ground terminal G1. The second ribs 2332 corresponding to the second ground terminal G2 are disposed along an extending direction of the connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the connection portion 223 of the first ground terminal G1 and the extending direction of the connection portion 223 of the second ground terminal G2, respectively, so as to achieve multi-position contact. In order to improve the reliability of the contact between the first metal shield 23 and the first ground terminals G1 and the second ground terminals G2, in the illustrated embodiment of the present disclosure, referring to FIG. 13, a wall thickness of the first rib 2331, a wall thickness of the second rib 2332, and a wall thickness of a portion of the first main body 231 located between the first rib 2331 and the second rib 2332 are the same. Specifically, each of the first rib 2331 and the second rib 2332 includes a first rib section 233a parallel to the contact portion 221, a second rib section 233b parallel to the tail portion 222, and a third rib section 233c connecting the first rib section 233a and the second rib section 233b. Referring to FIG. 8, the first rib section 233a extends horizontally. The second rib section 233b extends vertically. The third rib section 233c extends obliquely. The first rib section 233a, the second rib section 233b and the third rib section 233c correspond to the first section 223a, the second section 223b and the third section 223c of the first ground terminal G1 and the second ground terminal G2, respectively.

The first extension portion 232 includes a plurality of first bulges 2321 protruding toward the corresponding contact portions 221 of the first ground terminals G1, a plurality of second bulges 2322 protruding toward the corresponding contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent wafer 2 so as to improve the shielding effect. In the illustrated embodiment of the present disclosure, referring to FIG. 15, a wall thickness of the first bulge 2321, a wall thickness of the second bulge 2322 and a wall thickness of a portion of the first extension portion 232 located between the first bulge 2321 and the second bulge 2322 are the same.

Figure 9:
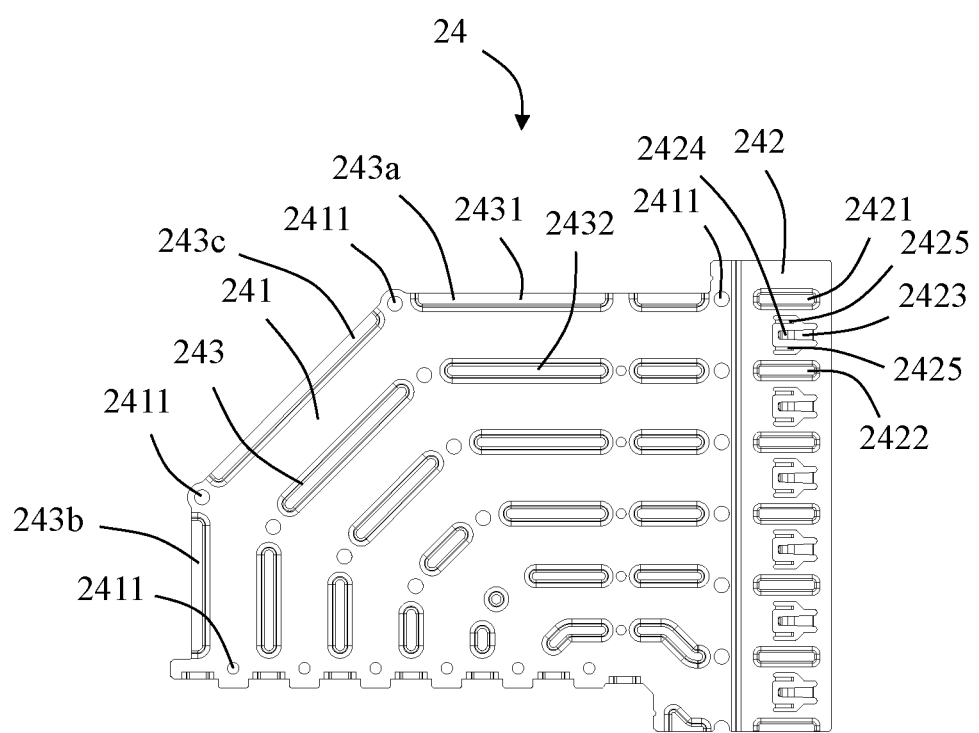
FIG. 9 is a side view of a second metal shield of the backplane connector.

Similarly, referring to FIGS. 5, 6 and 9, the second metal shield 24 includes a second main body portion 241 and a second extension portion 242 extending from the second main body portion 241. The second main body portion 241 is located on the other side of the connection portions 223 of the conductive terminals 22. The second extension portion 242 is located on the other side of the contact portions 221 of the conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the first insulating frame 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the connection portion 223 of the first ground terminal G1. The fourth ribs 2432 are disposed along the extending direction of the connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the connection portion 223 of the first ground terminal G1 and the extending direction of the connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. Specifically, each of the third rib 2431 and the fourth rib 2432 includes a first rib section 243a parallel to the contact portion 221, a second rib section 243b parallel to the tail portion 222, and a third rib section 243c connecting the first rib section 243a and the second rib section 243b. Referring to FIG. 9, the first rib section 243a extends horizontally. The second rib section 243b extends vertically. The third rib section 243c extends obliquely. The first rib section 243a, the second rib section 243b and the third rib section 243c correspond to the first section 223a, the second section 223b and the third section 223c of the first ground terminal G1 and the second ground terminal G2, respectively. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering. In other embodiments, each of the first ribs 2331, the second ribs 2332, the third ribs 2431 and the fourth ribs 2432 includes a through hole in order to expose a corresponding portion of the first ground terminal G1 and a corresponding portion of the second ground terminal G2, thereby it is easy to solder.

The second extension portion 242 includes a plurality of third bulges 2421 protruding toward the contact portions 221 of the first ground terminals G1, a plurality of fourth bulges 2422 protruding toward the contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent wafer 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

Figure 10:
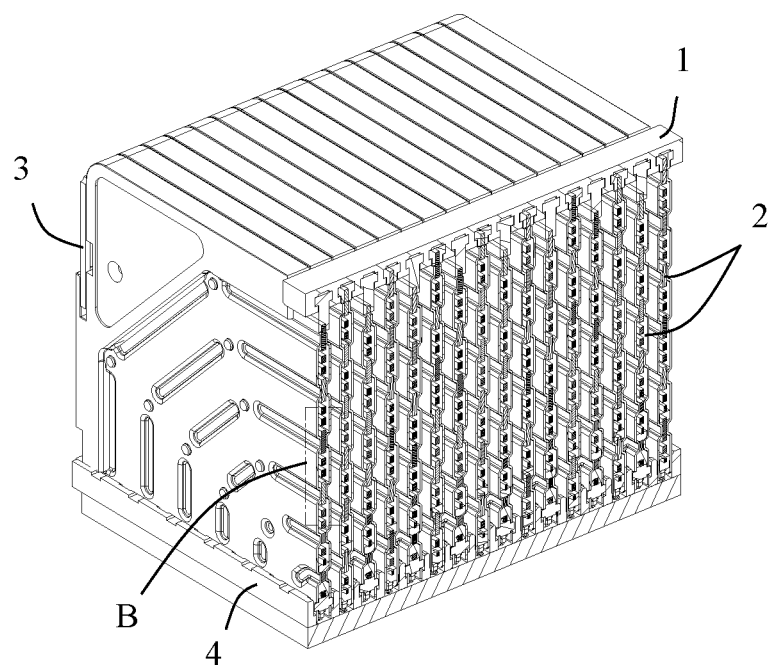
FIG. 10 is a partial perspective sectional view taken along line A'-A' in FIG. 1.
Figure 13:
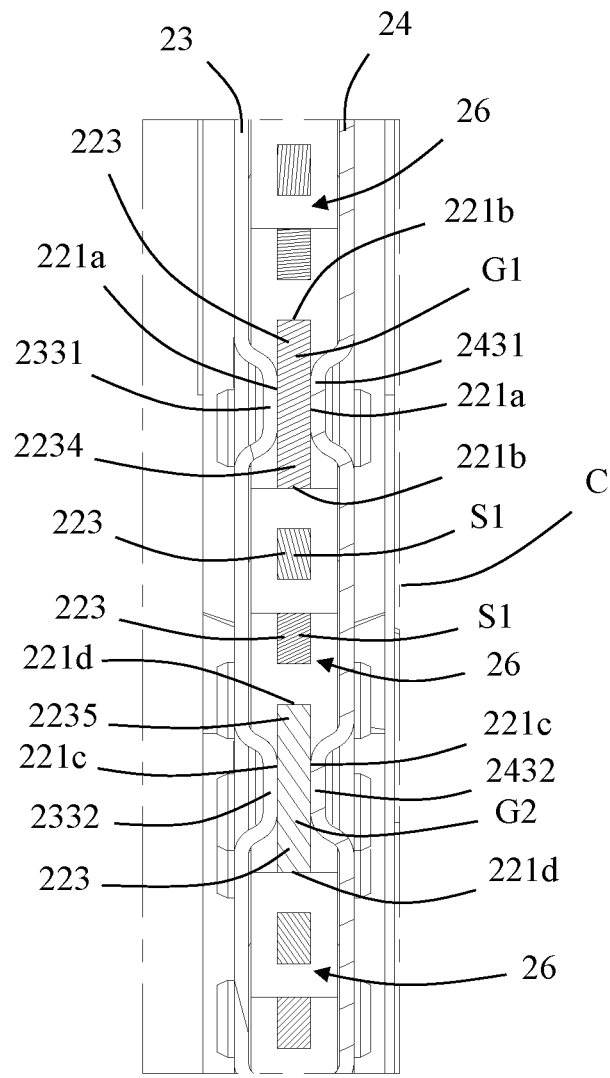
FIG. 13 is a partial enlarged view of a frame part C in FIG. 12.

Referring to FIGS. 10 and 13, in the illustrated embodiment of the present disclosure, the contact portion 221 and the connection portion 223 of the first ground terminal G1 have a first wide surface 221a and a first narrow surface 221b perpendicular to the first wide surface 221a. The contact portion 221 and the connection portion 223 of the second ground terminal G2 have a second wide surface 221c and a second narrow surface 221d perpendicular to the second wide surface 221c. The connection portions 223 of each pair of first differential signal terminals are located between the first narrow surface 221b of the first ground terminal G1 and the second narrow surface 221d of the second ground terminal G2 which are located on opposite sides of the connection portions 223 of each pair of first differential signal terminals. The contact portions 221 of each pair of first differential signal terminals are located between the first wide surface 221a of the first ground terminal G1 and the second wide surface 221c of the second ground terminal G2 which are located on opposite sides of the contact portions 221 of each pair of first differential signal terminals. In the illustrated embodiment of the present disclosure, a width of the first wide surface 221a and a width of the second wide surface 221c are greater than a width of each contact portion 221 of the first signal terminals S1, thereby better shielding can be provided for the contact portions 221 of the first signal terminals S1.

Figure 11:
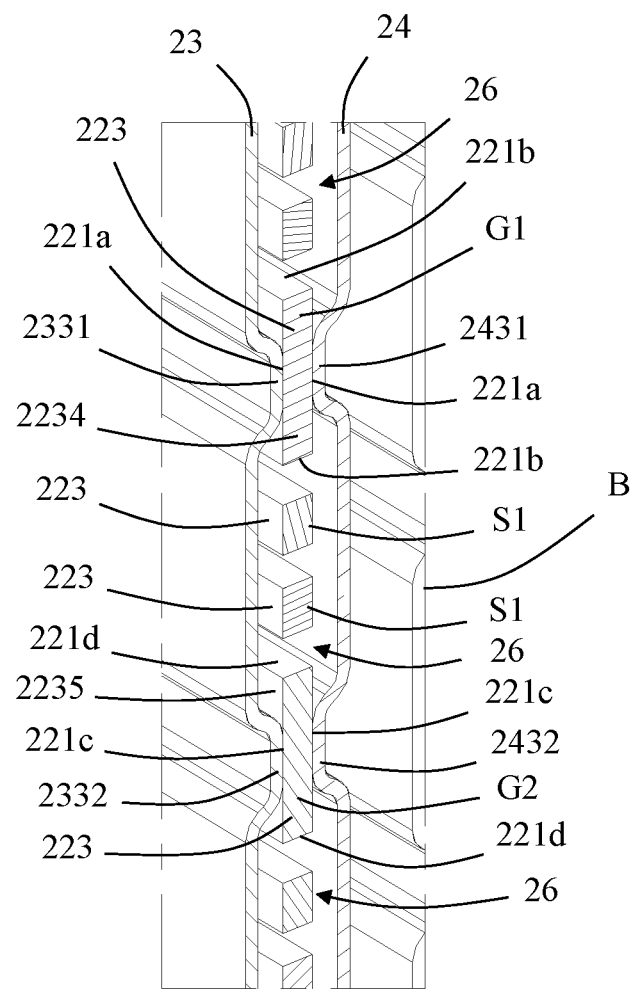
FIG. 11 is a partial enlarged view of a frame part B in FIG. 10.

Referring to FIG. 11, along a length of the connection portion 223 of the conductive terminal 22, the first rib 2331 of the first metal shield 23 and the third rib 2431 of the second metal shield 24 respectively contact two opposite sides of the connection portion 223 of the first ground terminal G1, and the second rib 2332 of the first metal shield 23 and the fourth rib 2432 of the second metal shield 24 respectively contact two opposite sides of the connection portion 223 of the second ground terminal G2, thereby forming a shielding cavity 26 surrounding the outer periphery of the connection portions 223 of each pair of first differential signal terminals. In the illustrated embodiment of the present disclosure, the first rib 2331 and the third rib 2431 respectively contact the first wide surface 221a of the connection portion 223 of the first ground terminal G1. The second rib 2332 and the fourth rib 2432 respectively contact the second wide surface 221c of the connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The connection portion 223 of the first ground terminal G1 includes a first tab portion 2234 protruding into the shielding cavity 26. The connection portion 223 of the second ground terminal G2 includes a second tab portion 2235 protruding into the shielding cavity 26. The connection portions 223 of the first differential signal terminals are located between the first tab portion 2234 and the second tab portion 2235. In the illustrated embodiment of the present disclosure, there are a plurality of the shielding cavities 26 which are disposed along an arrangement direction of each group of the conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Referring to FIG. 15, in the length of the contact portion 221 of the conductive terminal 22, the first bulge 2321 of the first metal shield 23 and the third bulge 2421 of the second metal shield 24 respectively contact two opposite side surfaces of the contact portion 221 of the first ground terminal G1, and the second bulge 2322 of the first metal shield 23 and the fourth bulge 2422 of the second metal shield 24 respectively contact two opposite side surfaces of the contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the contact portion 221 of the first ground terminal G1. The second bulge 2322 of the first metal shield 23 and the fourth bulge 2422 of the second metal shield 24 respectively contact the second narrow surfaces 221d of the contact portion 221 of the second ground terminal G2. The first extension portion 232, the second extension portion 242, the first ground terminal G1 and the second ground terminal G2 jointly form a shielding space 27 for accommodating the corresponding contact portions 221 of the first differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the conductive terminals 22. Two adjacent shielding spaces 27 share a single first ground terminal G1 or a single second ground terminal G2. One first wide surface 221a of the contact portion 221 of the shared first ground terminal G1 is exposed to the shielding space 27, and the other first wide surface 221a of the contact portion 221 of the shared first ground terminal G1 is exposed to an adjacent shielding space 27. Similarly, a first wide surface 221c of the contact portion 221 of the shared second ground terminal G2 is exposed to the adjacent shielding space 27, and the other wide surface 221c of the contact portion 221 of the shared second ground terminal G2 is exposed to another adjacent shielding space 27.

Figure 12:
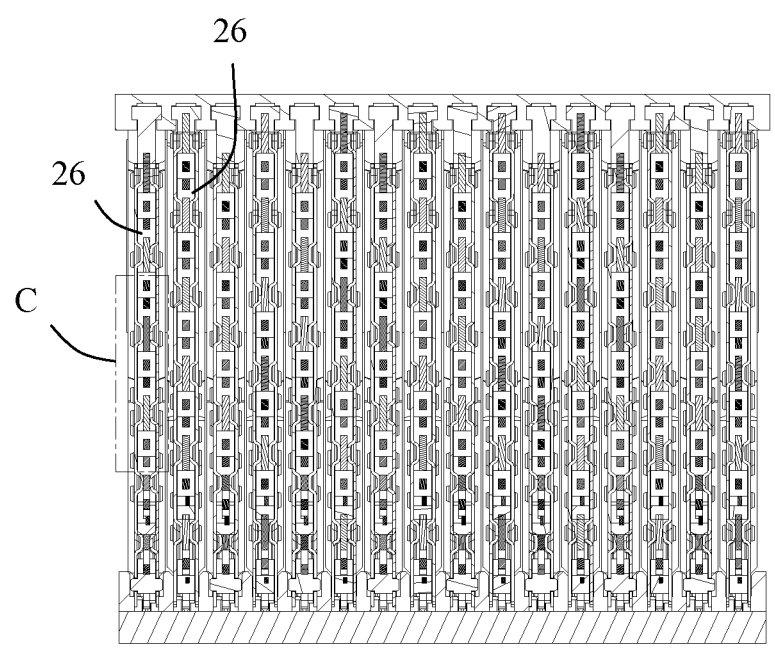
FIG. 12 is a front view of FIG. 10.
Figure 14:
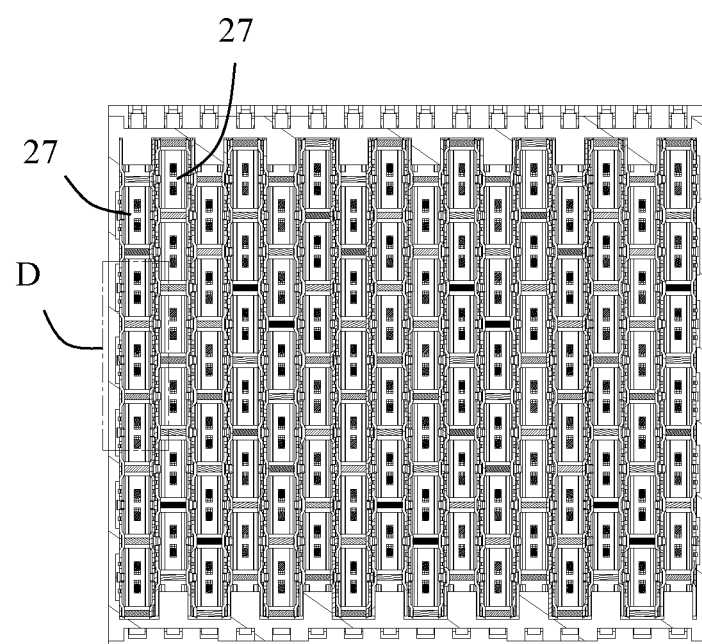
FIG. 14 is a schematic cross-sectional view taken along line B'-B' in FIG. 1.

In the illustrated embodiment of the present disclosure, there are multiple wafers 2 of the backplane connector 100, and the terminal arrangement of two adjacent wafers 2 are staggered. Correspondingly, the shielding cavities 26 at the same position of two adjacent wafers 2 are staggered (referring to FIG. 12), and the shielding spaces 27 at the same position of two adjacent wafers 2 are staggered (referring to FIG. 14).

Second Embodiment

Referring to FIGS. 16 to 26, a second embodiment of the present disclosure discloses another backplane connector 100 which is similar to the backplane connector 100 in the first embodiment. It is understandable to those skilled in the art that in the backplane connector 100 of the first embodiment and in the backplane connector 100 of the second embodiment, same reference numerals represent the same or corresponding component names. The components with the same numerals have the same or similar functions. If there is no conflict, the components in the first embodiment and the components in the second embodiment can be interchanged or combined.

In order to avoid repetitive descriptions, distinguishing features of the backplane connector 100 in the first embodiment and the second embodiment will be described in detail in the present disclosure.

In the backplane connector 100 of the second embodiment, the first extension portion 232 and/or the second extension portion 242 include limiting structures which restrict the contact portions 221 of the first ground terminal G1 and/or the contact portions 221 of the second ground terminal G2 in the front-rear direction and/or the top-bottom direction.

Specifically, as shown in FIGS. 18, 19, and 22 to 25, the contact portion 221 of the first ground terminal G1 includes a first limiting slot 2211 and a third limiting slot 2213 opposite to the first limiting slot 2211. The first limiting slot 2211 and the third limiting slot 2213 are symmetrically disposed on opposite sides of the contact portion 221 of the first ground terminal G1. The first limiting slot 2211 and the third limiting slot 2213 extend through the first narrow surfaces 221b of the first ground terminal G1, respectively. In the illustrated embodiment of the present disclosure, an angle between the first limiting slot 2211 and the front-rear direction, and an angle between the third limiting slot 2213 and the front-rear direction are approximately 45 degrees. Similarly, the contact portion 221 of the second ground terminal G2 includes a second limiting slot 2212 and a fourth limiting slot 2214 opposite to the second limiting slot 2212. The second limiting slot 2212 and the fourth limiting slot 2214 are symmetrically disposed on opposite sides of the contact portion 221 of the second ground terminal G2. The second limiting slot 2212 and the fourth limiting slot 2214 extend through the second narrow surfaces 221d of the second ground terminal G2, respectively. In the illustrated embodiment of the present disclosure, an angle between the second limiting slot 2212 and the front-rear direction, and an angle between the fourth limiting slot 2214 and the front-rear direction are approximately 45 degrees.

Figure 26:
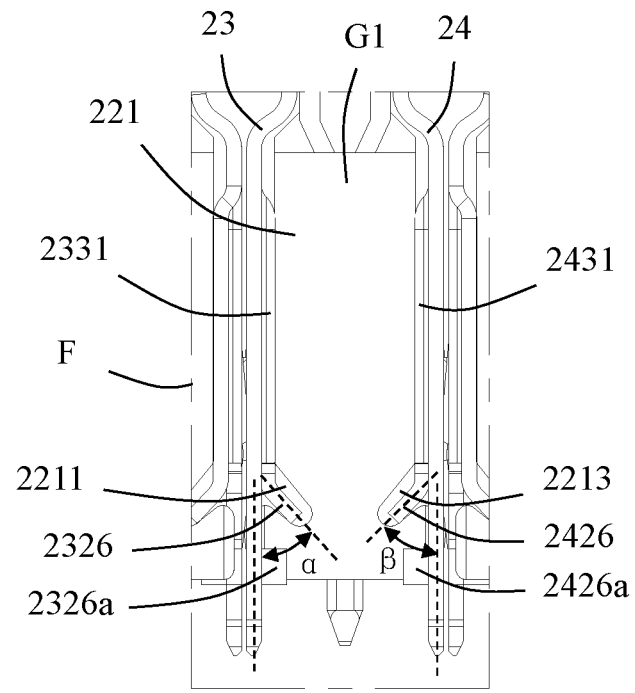
FIG. 26 is a partial enlarged view of a frame part F in FIG. 25.

The first extension portion 232 includes a first limiting protrusion 2326 locked in the first limiting slot 2211 and a second limiting protrusion 2327 locked in the second limiting slot 2212. Referring to FIG. 26, each of the first limiting protrusion 2326 and the second limiting protrusion 2327 forms an angle $\alpha$ of 45 degrees with respect to a vertical plane. Similarly, the second extension portion 242 includes a third limiting protrusion 2426 locked in the third limiting slot 2213 and a fourth limiting protrusion 2427 locked in the fourth limiting slot 2214. Each of the third limiting protrusion 2426 and the fourth limiting protrusion 2427 forms an angle $\beta$ of 45 degrees with respect to the vertical plane. The first limiting protrusion 2326 and the third limiting protrusion 2426 are symmetrically disposed on opposite sides of the contact portion 221 of the first ground terminal G1. The first limiting protrusion 2326 and the third limiting protrusion 2426 are adapted to restrict the contact portion 221 of the first ground terminal G1 in the front-rear direction to prevent it from moving backwardly. The second limiting protrusion 2327 and the fourth limiting protrusion 2427 are symmetrically disposed on opposite sides of the contact portion 221 of the second ground terminal G2. The second limiting protrusion 2327 and the fourth limiting protrusion 2427 are adapted to restrict the contact portion 221 of the second ground terminal G2 in the front-rear direction.

In the illustrated embodiment of the present disclosure, the first limiting protrusion 2326 is located at a front free end of the first bulge 2321 and is integrally stamped from the first bulge 2321. The second limiting protrusion 2327 is located at a front free end of the second bulge 2322 and is integrally stamped from the second bulge 2322. The third limiting protrusion 2426 is located at a front free end of the third bulge 2421 and is integrally stamped from the third bulge 2421. The fourth limiting protrusion 2427 is located at a front free end of the fourth bulge 2422 and is integrally stamped from the fourth bulge 2422.

In addition, the first extension portion 232 further includes two first clamping blocks 2326a and two second clamping blocks 2327a. The two first clamping blocks 2326a include a first clamping groove 2326b for restricting the contact portion 221 of the first ground terminal G1 in the vertical direction. The two second clamping blocks 2327a include a second clamping groove 2327b for restricting the contact portion 221 of the second ground terminal G2 in the vertical direction. Similarly, the second extension portion 242 further includes two third clamping blocks 2426a and two fourth clamping blocks 2427a. The two third clamping blocks 2426a include a third clamping groove 2426b for restricting the contact portion 221 of the first ground terminal G1 in the vertical direction. The two fourth clamping blocks 2427a include a fourth clamping groove 2427b for restricting the contact portion 221 of the second ground terminal G2 in the vertical direction.

Of course, in other embodiments, the first clamping block 2326a, the second clamping block 2327a, the third clamping block 2426a and the fourth clamping block 2427a can also be provided as one which is used to abut against the corresponding contact portions 221 of the first ground terminal G1 and the second ground terminal G2 in the vertical direction so as to achieve position restriction. In the illustrated embodiment of the present disclosure, the first clamping block 2326a is located at a front end of the first limiting protrusion 2326. The second clamping block 2327a is located at a front end of the second limiting protrusion 2327. The third clamping block 2426a is located at a front end of the third limiting protrusion 2426. The fourth clamping block 2427a is located at a front end of the fourth limiting protrusion 2427.

In the illustrated embodiment of the present disclosure, the limiting structures include the first limiting protrusion 2326, the second limiting protrusion 2327, the third limiting protrusion 2426 and the fourth limiting protrusion 2327.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A wafer, comprising:
a plurality of conductive terminals, the conductive terminals comprising differential signal terminals, a first ground terminal and a second ground terminal, the differential signal terminals being located between the first ground terminal and the second ground terminal; each conductive terminal comprising a contact portion and a connection portion; and
an insulating frame, at least parts of the connection portions of the conductive terminals being fixed to the insulating frame, the contact portions of the conductive terminals extending beyond the insulating frame;
wherein the connection portions of the differential signal terminals, the connection portion of the first ground terminal and the connection portion of the second ground terminal are located in a first plane; and
wherein the first ground terminal comprises a first torsion portion connecting the connection portion of the first ground terminal and the contact portion of the first ground terminal; the second ground terminal comprises a second torsion portion connecting the connection portion of the second ground terminal and the contact portion of the second ground terminal; the contact portions of the differential signal terminals are located between the contact portion of the first ground terminal and the contact portion of the second ground terminal; and the contact portion of the first ground terminal and the contact portion of the second ground terminal are both perpendicular to the first plane.

2. The wafer according to claim 1, wherein the first torsion portion and the second torsion portion are insert-molded with the insulating frame.

3. The wafer according to claim 1, wherein the contact portion of the first ground terminal and the contact portion of the second ground terminal are parallel; and wherein either a width of the contact portion of the first ground terminal or a width of the contact portion of the second ground terminal is larger than a width of the contact portion of each differential signal terminal.

4. The wafer according to claim 1, wherein the first ground terminal and the second ground terminal are stamped and twisted from a metal plate; and wherein a thickness of the connection portion of the first ground terminal, a thickness of the contact portion of the first ground terminal, a thickness of the connection portion of the second ground terminal and a thickness of the contact portion of the second ground terminal are the same.

5. The wafer according to claim 1, further comprising:
a first metal shield comprising a first extension portion located on one side of the contact portions of the conductive terminals; and
a second metal shield comprising a second extension portion located on the other side of the contact portions of the conductive terminals;
wherein the first extension portion comprises a first bulge protruding toward the first ground terminal and a second bulge protruding toward the second ground terminal;
wherein the second extension portion comprises a third bulge protruding toward the first ground terminal and a fourth bulge protruding toward the second ground terminal; and
wherein the first bulge and the third bulge are in contact with opposite side surfaces of the contact portion of the first ground terminal, respectively; the second bulge and the fourth bulge are in contact with opposite side surfaces of the contact portion of the second ground terminal; the first extension portion, the second extension portion, the contact portion of the first ground terminal and the contact portion of the second ground terminal jointly form a shielding space enclosing the contact portions of the differential signal terminals.

6. The wafer according to claim 5, wherein the first extension portion and/or the second extension portion comprise a limiting structure for limiting the contact portion of the first ground terminal and/or the contact portion of the second ground terminal.

7. The wafer according to claim 6, wherein the limiting structure comprises a first limiting protrusion disposed on the first extension portion, and the contact portion of the first ground terminal comprises a first limiting slot to mate with the first limiting protrusion;
wherein the limiting structure comprises a second limiting protrusion disposed on the first extension portion, and the contact portion of the second ground terminal comprises a second limiting slot to mate with the second limiting protrusion;
wherein the limiting structure comprises a third limiting protrusion disposed on the second extension portion, and the contact portion of the first ground terminal comprises a third limiting slot to mate with the third limiting protrusion; and
wherein the limiting structure comprises a fourth limiting protrusion disposed on the second extension portion, and the contact portion of the second ground terminal comprises a fourth limiting slot to mate with the fourth limiting protrusion.

8. The wafer according to claim 7, wherein the first limiting protrusion and the second limiting protrusion form an angle of 45 degrees with respect to a vertical plane; the third limiting protrusion and the fourth limiting protrusion form an angle of 45 degrees with respect to the vertical plane; the first limiting protrusion and the third limiting protrusion are symmetrically disposed on opposite sides of the contact portion of the first ground terminal; and the second limiting protrusion and the fourth limiting protrusion are symmetrically disposed on opposite sides of the contact portion of the second ground terminal.

9. The wafer according to claim 6, wherein the limiting structure comprises two first clamping blocks disposed on the first extension portion, and the two first clamping blocks form a first clamping groove to limit the contact portion of the first ground terminal in a vertical direction; and
the limiting structure comprises two third clamping blocks disposed on the second extension portion, and the two third clamping blocks form a third clamping groove to limit the contact portion of the first ground terminal in the vertical direction.

10. A backplane connector, comprising:
a plurality of wafers;
a header to install the wafers; and
a spacer combining the wafers into a whole;
each wafer comprising:
- a plurality of conductive terminals comprising differential signal terminals, a first ground terminal and a second ground terminal, the differential signal terminals being located between the first ground terminal and the second ground terminal; each conductive terminal comprising a contact portion and a connection portion; and
- an insulating frame, at least parts of the connection portions of the conductive terminals being fixed to the insulating frame, the contact portions of the conductive terminals extending beyond the insulating frame;
- wherein the connection portions of the differential signal terminals, the connection portion of the first ground terminal and the connection portion of the second ground terminal are located in a first plane; and
- wherein the first ground terminal comprises a first torsion portion connecting the connection portion of the first ground terminal and the contact portion of the first ground terminal; the second ground terminal comprises a second torsion portion connecting the connection portion of the second ground terminal and the contact portion of the second ground terminal; the contact portions of the differential signal terminals are located between the contact portion of the first ground terminal and the contact portion of the second ground terminal; and the contact portion of the first ground terminal and the contact portion of the second ground terminal are both perpendicular to the first plane.

* * * * *